United States Patent [19]

Lee et al.

[11] Patent Number: 5,014,161

[45] Date of Patent: May 7, 1991

[54] SYSTEM FOR DETACHABLY MOUNTING SEMICONDUCTORS ON CONDUCTOR SUBSTRATE

[75] Inventors: James C. K. Lee, Los Altos Hills; Gene M. Amdahl, Atherton; Richard Beck, Cupertino; Chune Lee, San Francisco; Edward Hu, Sunnyvale, all of Calif.

[73] Assignee: Digital Equipment Corporation, Maynard, Mass.

[21] Appl. No.: 477,133

[22] Filed: Feb. 7, 1990

Related U.S. Application Data

[63] Continuation of Ser. No. 328,726, Mar. 22, 1989, abandoned, which is a continuation of Ser. No. 860,725, May 7, 1986, abandoned, which is a continuation-in-part of Ser. No. 757,600, Jul. 22, 1985, Pat. No. 4,729,166.

[51] Int. Cl.5 ............ H05K 7/20

[52] U.S. Cl. ............ 361/388; 361/403

[58] Field of Search ............ 361/386, 387, 388, 400, 361/403; 357/80, 81; 439/71

[56] References Cited

U.S. PATENT DOCUMENTS

| | | | |
|---|---|---|---|
| 3,605,062 | 7/1969 | Tinkelenberg | 361/403 |
| 3,862,790 | 1/1975 | Davies et al. | 339/17 |
| 3,982,320 | 9/1976 | Buchoff et al. | 29/630 |
| 4,003,621 | 1/1977 | Lamp | 339/15 |
| 4,295,700 | 10/1981 | Sado | 339/61 |
| 4,330,165 | 5/1982 | Sado | 339/59 |
| 4,441,119 | 4/1984 | Link | 339/17 CF |
| 4,449,774 | 5/1984 | Takashi et al. | 339/59 |
| 4,506,938 | 3/1985 | Madden | 339/17 CF |
| 4,520,562 | 6/1985 | Sado et al. | 29/878 |
| 4,597,617 | 7/1986 | Enochs | 339/17 CF |
| 4,667,219 | 5/1987 | Lee et al. | 357/68 |

FOREIGN PATENT DOCUMENTS

| | | |
|---|---|---|
| 57-166051 | 10/1982 | Japan . |
| 60-263447 | 12/1985 | Japan . |
| WO85/00467 | 1/1985 | PCT Int'l Appl. . |

OTHER PUBLICATIONS

IBM Technical Disclosure Bulletin, vol. 27, No. 8, Jan. 1985, p. 4855, New York, U.S.; K. Hinrichsmeyer et al.: "Solder-Filled Elastomeric Spacer".

IBM Technical Disclosure Bulletin, vol. 25, No. 4, Sep. 1982, pp. 1801–1802, New York, U.S.; E. W. Neumann et al.: "Electrically Conductive Array in an Elastomeric Material".

Buchoff (1980) Microelectronics Manuf. and Test, Oct.

Buchoff (1983) Electronics, Jun.

IBM Tech. Discl. Bulletin, vol. 13, No. 1, p. 58.

IBM Tech. Discl. Bulletin, vol. 19, No. 4, pp. 1270–1271.

IBM Tech Discl. Bulletin, vol. 20, No. 10, pp. 3919–3920.

IBM Tech. Discl. Bulletin, vol. 25, No. 4, pp. 1801–1802.

*Primary Examiner*—A. D. Pellinen

*Assistant Examiner*—Jeffrey A. Gaffin

*Attorney, Agent, or Firm*—Cesari and McKenna

[57] ABSTRACT

A semiconductor mounting system is provided for the detachable surface mounting of one or more semiconductor dies on a conductor substrate, such as a ceramic substrate or printed circuit board. The system employs a resilient, anisotropic conductor pad which is interposed between the semiconductor die and the conductor substrate. The conductor pad is capable of conducting electric signals in one direction only, and insulates in the other two orthogonal directions. Thus, by compressing the semiconductor die and resilient conductor pad against the conductor substrate, electrical contact is established between contacts on the semiconductor die and corresponding contacts on the conductor substrate. In the preferred embodiment, additional conductor pads are placed over the semiconductor dies, and a heat sink placed over the second conductor pads. In this way, the semiconductor dies are mounted in a resilient structure for protection, while heat dissipation is enhanced by the metallic elements in the second conductor pad.

20 Claims, 3 Drawing Sheets

SYSTEM FOR DETACHABLY MOUNTING SEMICONDUCTORS ON CONDUCTOR SUBSTRATE

This application is a file wrapper continuation of Ser. No. 328,726, filed Mar. 22, 1989, now abandoned, which was a file wrapper continuation of Ser. No. 860,725, filed May 7, 1986, now abandoned, which was a continuation-in-part of Ser. No. 757,600, filed July 22, 1985, now U.S. Pat. No. 4,729,166.

BACKGROUND OF THE INVENTION

1. Field of the Invention

The present invention relates generally to systems for mounting semiconductor dies on conductor substrates, and more particularly to a system which provides for detachably mounting such semiconductor dies without soldering by interposing a resilient anisotropic conductor pad between the semiconductor die and the conductor substrate.

Integrated circuits are typically fabricated on relatively large silicon wafers which are then divided into a plurality of individual circuits, referred to as dies or chips. The individual dies may then be packaged in a variety of ways, including the familiar dual-in-line package, referred to as the DIP, where the die is encapsulated in plastic or ceramic. The individual DIPs may then be mounted and interconnected on printed circuit boards in order to build up the desired circuitry. Although workable, the use of discrete packages, such as DIPs, can result in unacceptable signal propagation delay time between the separated integrated circuits.

An approach which has been developed in order to reduce such signal propagation delay time involves mounting a plurality of discrete dies in a common enclosure on a single conductor substrate, typically a multilayer ceramic substrate. The dies are usually soldered directly to the conductor substrate and may be spaced together very closely in order to reduce the propagation delay time. The use of a common enclosure avoids the necessity of individually packaging the chips for protection.

The use of such multichip modules, however, suffers from a number of problems. It is desirable to have the module as small as possible in order to reduce the signal propagation delay as much as possible. The small module size makes it very difficult to locate and attach the individual dies. Moreover, the large number of dies in a single module greatly increases the likelihood of failure of the module since the chance of at least one die failing is greatly increased. Since the modules must be tested after assembly, the failure of a single die necessitates either discarding the entire module, which can be prohibitively expensive, or detaching and replacing the die or dies which have failed. Detaching the die can be very difficult since in most cases it will have been soldered to the conductor substrate. The problem is exacerbated if, as is frequently the case, the die has also been soldered to a heat sink to enhance heat dissipation.

For the above reasons, it would be desirable to provide alternate systems for the high density mounting of a plurality of semiconductor dies on a single conductor substrate. It would be particularly desirable to provide such systems which allow for detachably mounting the dies on the substrate without solder so that the dies may be easily removed from the substrate in the event of failure. The system should also provide for adequate heat dissipation without the need to solder or otherwise attach the dies to a heat sink, and should additionally provide for a minimum signal propagation delay time between the dies and the conductor substrate. Also, the electrical connections between the dies and the substrate should have a low resistance, and allow for differential thermal expansion between the dies and the substrate which is a particular problem with larger semiconductor dies.

2. Description of the Relevant Art

Modules for mounting a plurality of semiconductor dies on a common conductor substrate are described in IBM Technical Disclosure Bulletin Vol. 13, page 58; Vol. 19, pages 1270–1272; and Vol. 20, pages 3919–3920.

IBM Technical Disclosure Bulletin Vol. 25, pages 1801–1802, discloses an elastomeric layer having widely spaced, discrete spring elements embedded therein. The elastomeric layer is interposed between a chip carrier and a pin carrier to provide for electrical connection.

Elastomeric, anisotropic conductors are described in U.S. Pat. Nos. 4,003,621; 3,982,320, and 3,862,790. None of these patents suggests the use of such conductors for directly mounting a semiconductor die on a conductor substrate.

Co-pending applications Ser. No. 604,783, now U.S. Pat. No. 4,667,219 and Ser. No. 605,018, now U.S. Pat. No. 4,667,220 assigned to the assignee of the present application, disclose the use of soldered, flexible connectors mounted in a connector board for surface mounting of semiconductor dies.

SUMMARY OF THE INVENTION

The present invention is a system for the detachable surface mounting of semiconductor dies on conductor substrates. The system allows for high density packing of a plurality of individual dies on a common conductor substrate in order to reduce the package size and minimize the signal propagation delay time between the dies. The system eliminates the need for solder connecting the dies to the substrate, and thus allows for disassembly and replacement of defective chips within the system and minimizes damage to the chips from the soldering operation. The system provides for low resistance contacts between the dies and the conductor board, and can provide for enhanced heat dissipation when desired.

The system of the present invention is useful for mounting semiconductor dies of the type having a plurality of signal, power, and/or ground contacts formed on one face thereof. Such contacts are usually arranged in a two-dimensional array extending across the face, but may be arranged peripherally. The conductor substrate, which may be any conventional conductor board, including ceramic substrates and printed circuit boards, will have a plurality of surface contacts arranged in a pattern corresponding at least partly to the pattern of contacts on the semiconductor dies. Interconnection between the dies and the conductor substrate is effected by a resilient, anisotropic conductor pad comprising a plurality of discrete conductive elements embedded in an elastomeric matrix. By spacing the conductors sufficiently closely, electrical conduction between contacts located on opposite sides of the pad is assured. In this way, alignment of the conductor pad is not necessary, so long as the semiconductor die and the conductor substrate are themselves in proper alignment.

In the preferred embodiment, alignment between the dies and the conductor substrate is achieved using a nest plate having a plurality of apertures. The nest plate is mounted on the conductor substrate, and the conductor pads and semiconductor dies are placed in the apertures which are located to assure proper alignment. A cover is then placed over the nest plate to compress the semiconductor die against the resilient conductor pad in order to establish low resistance electrical conduction. Preferably, the cover is a heat sink, and a second resilient conductor pad may be interposed between the upper face of the semiconductor die and the heat sink. The resilient pad helps evenly distribute downward force on the semiconductor die, and the metal conductors in the pad provide for enhanced thermal dissipation from the die to the heat sink.

DESCRIPTION OF THE PREFERRED EMBODIMENTS

According to the present invention, semiconductor dies are detachably surface mounted on conductor substrates by interposing resilient, anisotropic conductor pads therebetween. The conductor pads provide for electrical conduction between contacts formed on one face of the chip and corresponding contacts formed on one face of the substrate. The mounting system is particularly useful for mounting a plurality of chips on a common substrate, although it will also find use in mounting single dies on a substrate.

Semiconductor dies are normally formed in multiples on a single silicon wafer on the order of several inches in diameter. The wafer is then divided into individual dies, usually on the order of 50 square millimeters or smaller, and each die will include thousands of individual transistors and other circuit elements. The die may provide memory, logic, or a variety of other useful functions. Of particular interest to the present invention are dies having electrical signal contacts formed on one face thereof. Such contacts will provide for power and ground connections, as well as signal connections. Typically, the contacts will be formed as metal contact pads in a predetermined two-dimensional array extending across the surface of the die. Alternatively, the contact pads may be formed linearly along the periphery of the face. The present invention provides a system for interconnecting such contact pads, including signal, power, and ground contact pads, to corresponding contact pads formed on a connector substrate.

The connector substrate may be any conventional connector substrate, including ceramic substrates, plastic substrates, printed circuit boards, and the like. The connector substrate will normally include internal metal traces defining appropriate conductive pads between preselected locations on the conductor board. For example, a contact pad connected to a semiconductor die may be interconnected with a contact pad on the same semiconductor die, with a contact pad on a different semiconductor die, or with an external contact on the conductor substrate. Such external contacts may be in the form of pins, solder pads, spring connectors, or the like.

The present invention employs a resilient, anisotropic conductor pad as the conductive interface between the semiconductor die and the conductive substrate. Such conductor pads must provide for anisotropic electrical conduction in one direction only, while providing very high resistivity, on the order of $10^{15}$ ohm-cm, in the other two orthogonal directions. In this way, electrical conduction is provided between electrical contacts which are located directly across from each other on opposite sides of the conductor pad, while the contacts are electrically isolated from all other contacts which are not so aligned.

Figure 1:
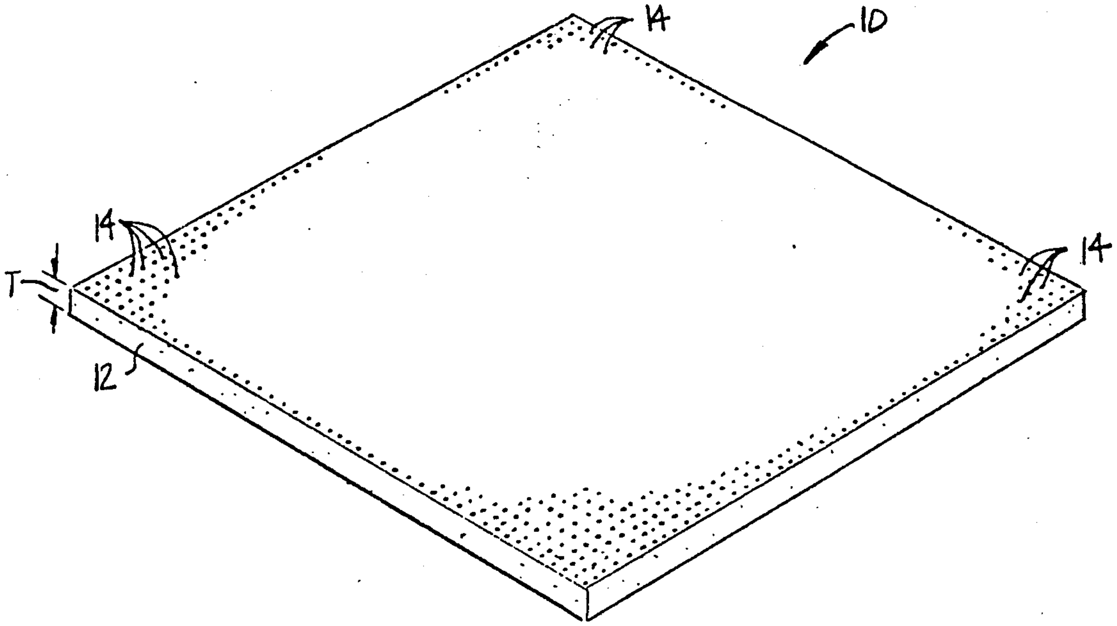
FIG. 1 illustrates a resilient anisotropic conductor pad useful in the mounting system of the present invention.
Figure 2:
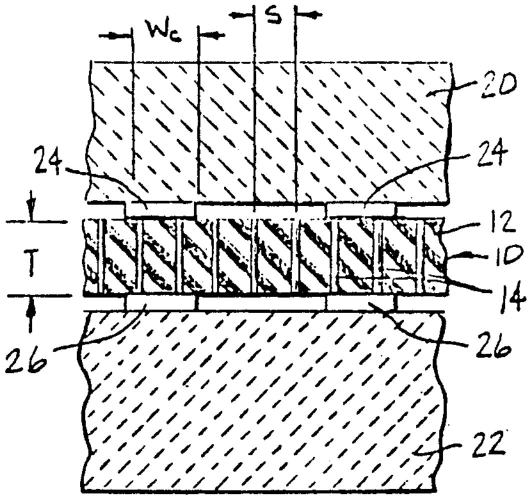
FIG. 2 is a detailed cross-sectional view illustrating the resilient anisotropic conductor pad of the present invention interposed between a semiconductor die and a conductor substrate.

Referring now to FIGS. 1 and 2, a resilient, anisotropic conductor pad 10 suitable for use in the present invention will typically comprise an elastomeric matrix 12 having a plurality of discrete conductive elements 14 embedded therein. The conductive elements 14 will be oriented parallel to one another so that contact between any two elements 14 is avoided. In this way, an electrical signal which is introduced to one of the elements 14 will be conducted through the pad 10 by that element only. The elastomeric matrix may be formed from a variety of electrically-insulating elastomers, such as silicone rubbers, including dimethyl, methyl-phenyl, methyl-vinyl, and halogenated siloxanes; butadiene-styrene, butadiene-acrylonitrile, butadiene-isobutylene, and the like.

The conductive elements 14 will usually be conductive metals, such as copper, aluminum, silver, gold, or alloys thereof, although conductive carbon fibers and the like may also find use.

The dimensions of the resilient, anisotropic conductive pad 10 will vary depending on the particular mounting system being constructed. Usually, the thickness T will be made as small as possible consistent with the need to maintain a resilient interface between the semiconductor die and the ceramic substrate. The thickness T will usually be in the range from about 0.01 to 0.30 inches, more usually in the range from 0.03 to 0.15 inches. The peripheral dimensions will frequently correspond to those of the semiconductor die being mounted, although the dimensions may be greater.

Referring now to FIG. 2, the conductor pad 10 is interposed between a semiconductor die 20 and a conductor substrate 22. The semiconductor die 20 includes a plurality of surface contact pads 24 (only two of which are illustrated in FIG. 2) which are disposed directly against contact pad 10, while substrate 22 includes a plurality of corresponding contact pads 26 which are disposed against the opposite face of the conductive pad 10. The spacing S between adjacent conductors 14 will be selected to be less than the width $W_c$ of the contact pad 24 or 26. In this way, contact between at least one element 14 and each contact pad 24 or 26 is assured. Usually, the spacing S will be selected to be less than half the width $W_c$ of the contact pads 24 and 26 in order to assure that at least 2, and usually 4, conductors 14 will be in contact with each contact pad. In this way, electrical conduction between contact pads 24 on the die 20 and contact pads 26 on the substrate 22 is accomplished so long as the die and the substrate are properly aligned. The alignment of the conductive pad 10 is not critical so long as the spacing of the conductive elements 14 is uniform and sufficiently close.

Suitable anisotropic conductors may be fabricated by a variety of techniques. Suitable techniques are disclosed in U.S. Pat. No. 4,003,621 and U.S. Pat. No. 4,729,166, the latter of which is assigned to the assignee of the present invention. The relevant disclosures of both of these references are incorporated herein by reference.

Figure 3:
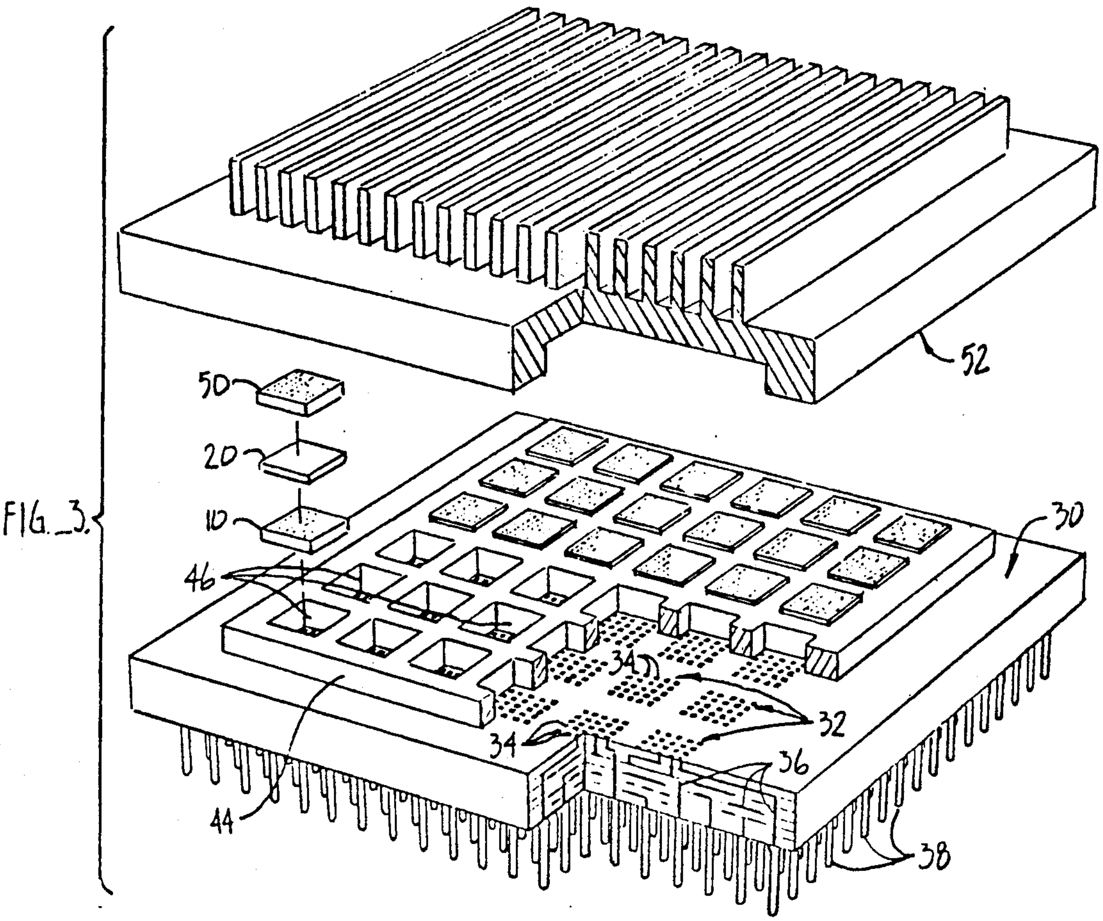
FIG. 3 is an exploded view of the multiple die mounting system of the present invention, with portions broken away.
Figure 4:
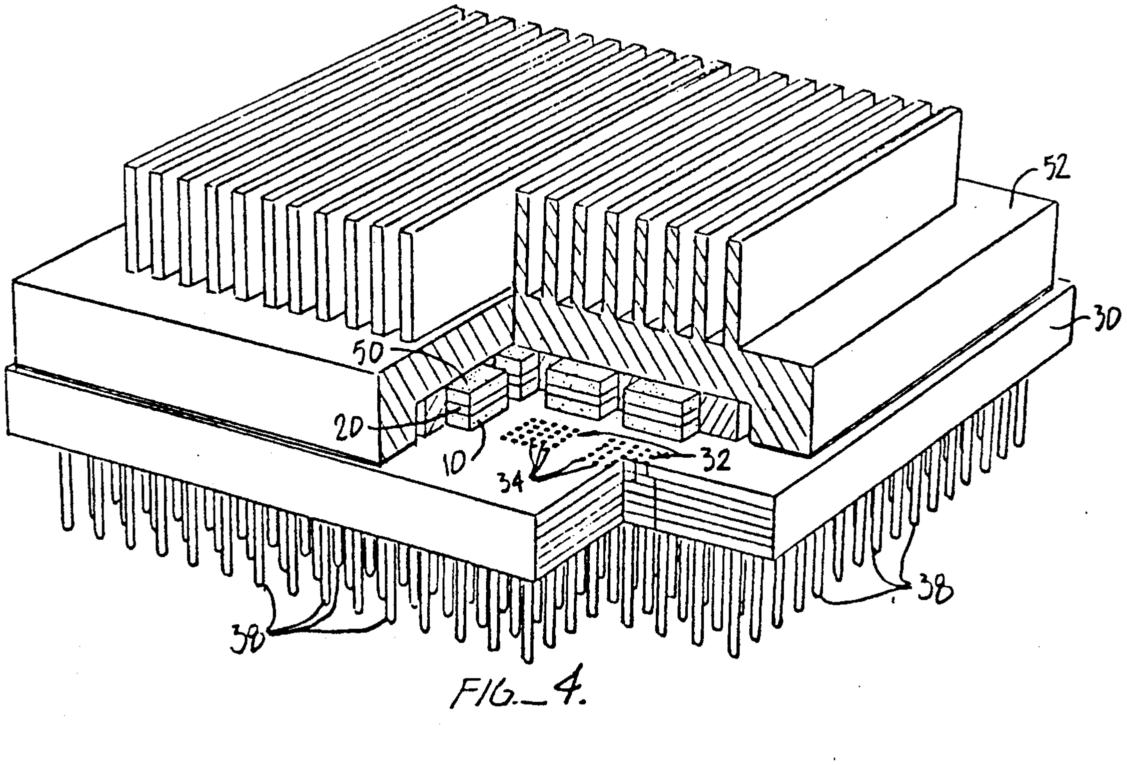
FIG. 4 illustrates the assembled mounting system of FIG. 3.

Referring now to FIGS. 3 and 4, a specific multiple semiconductor die mounting system constructed in accordance with the principles of the present invention will be described. A ceramic substrate 30 includes a plurality of conductor regions 32 formed on one face thereof. Each conductor region 32 includes a multiplicity of individual contact pads 34.

As depicted in FIGS. 3 and 4, the contact pads 34 forming each conductive region 32 can arranged in a two-dimensional array with some contact pads 34 inside an area defined by other contacts forming the perimeter of the conductive region 32. The interior-located contact pads 34, are, of course, provided for electrical connection to die contact pads 24 similarly interior-located on the adjacent face of the semiconductor die 20. The ceramic substrate 30 further includes internal metallic traces 36 which interconnect the contacts 34 with other contacts 34 and connector pins 38. Connector pins 38 provide for connecting the module with external circuitry by means of a conventional pin receptacle (not shown) which may be mounted on a printed circuit board or other mounting surface.

A nest plate 44 includes a plurality of apertures 46 which are arranged in a pattern corresponding to the pattern of contact regions 32 on the substrate 30. By placing the nest plate over the ceramic substrate 30, the apertures 46 will be aligned with the contact regions 32 and will define receptacles for receiving the resilient conductor pads 10 and semiconductor dies 20. The apertures 46 will be aligned so that the individual contacts 24 (FIG. 2) on the semiconductor die 20 are aligned with corresponding contacts 32 on the substrate 30.

A second anisotropic conductor pad 50 will usually be mounted directly over the semiconductor pad 20. The pad 50 serves two purposes. First, the semiconductor 20 will be interposed between two resilient pads 10 and 50 which will protect the die during the module assembly procedure. Second, by providing the metallic conductors within the pad 50, thermal conduction from the die to a heat sink 52 is facilitated. The heat sink 52 acts as a cover when it is placed over the nest plate 44, compressing the layered structure of the resilient pads 10 and 50 and the semiconductor die 20.

The fully assembled module, with a portion broken away, is illustrated in FIG. 4.

Figure 5:
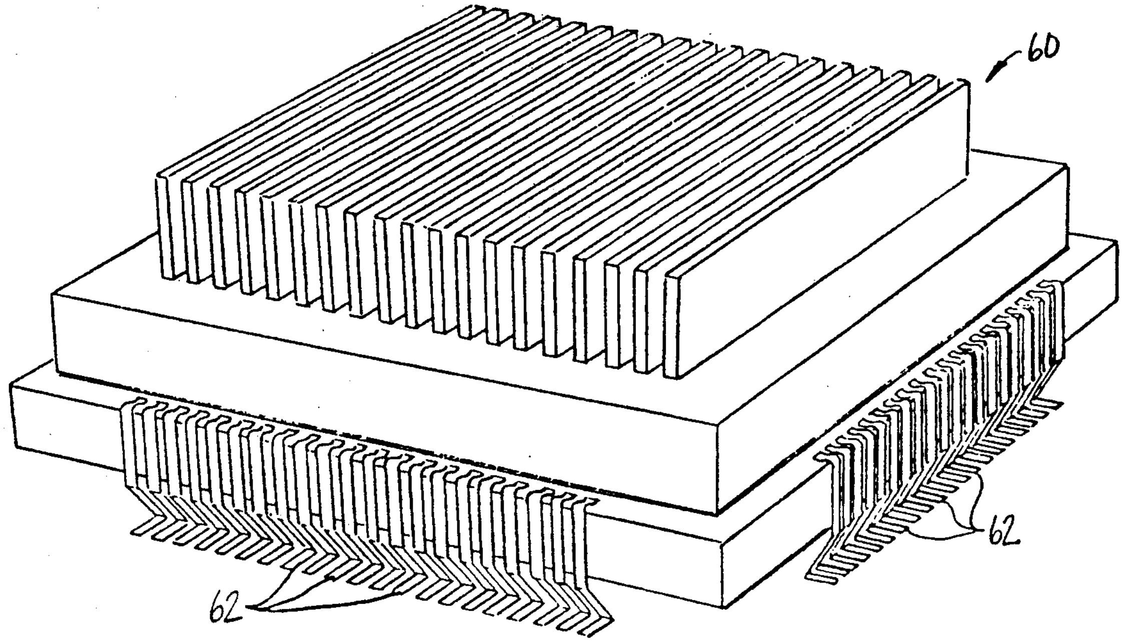
FIG. 5 is an alternate embodiment of the mounting system of the present invention adapted for surface mounting on a printed circuit board.

Referring now to FIG. 5, an alternate embodiment of the multisemiconductor module of the present invention is illustrated. The module 60 is identical to the module 30 of FIGS. 3 and 4, except that the connector pins 38 are replaced by peripheral solder connectors 62. The solder connectors 62 are conventional and adapted for surface mounting on a printed circuit board or other suitable surface.

Figure 6:
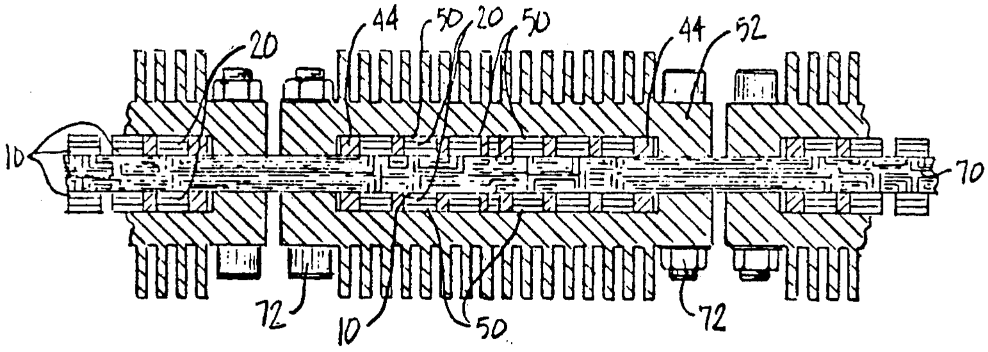
FIG. 6 is a second alternate embodiment of the mounting system of the present invention where semiconductor dies are mounted directly on opposite sides of a printed circuit board.

Referring now to FIG. 6, the mounting system of the present invention may be used to surface mount semiconductor dies directly on printed circuit boards or ceramic boards without use of discrete mounting modules. A printed circuit board 70 is a multilayer conductive substrate having a plurality of contact regions formed on both surfaces thereof. Contact pads are mounted directly over the contact regions, while semiconductor dies 20 are mounted over the conductor pads 10. Second conductor pads 50 are mounted over the semiconductor dies 20, and the layered structures are aligned in nest plates 44, as described previously. The nest plates 44, in turn, are covered by heat sinks 52 which are detachably secured directly to the printed circuit board 70 by bolts 72.

It will be appreciated that each of the mounting systems described hereinabove may be disassembled without the need to break an solder contacts or other permanent connections made between the semiconductor dies and the conductor substrates. This is a particular advantage since it allows the entire mounting system to be assembled, and fully tested and burned in. If any of the individual semiconductor dies are found to be defective, the mounting system may be disassembled, the defective die removed and replaced. This eliminates the need to dispose of the expensive mounting systems because of the failure of a single component.

Although the foregoing invention has been described in some detail by way of illustration and example for purposes of clarity of understanding, it will be obvious that certain changes and modifications may be practiced within the scope of the appended claims.

What is claimed is:

1. A semiconductor die mounting system comprising:

a) a conductor substrate having an array of substrate contacts on a substrate face thereof;

b) at least one semiconductor die having first and second opposed die faces and a plurality of die contacts on the first die face thereof disposed in alignment with corresponding substrate contacts on the conductor substrate;

c) a conductor pad disposed between the substrate and the die having first and second opposed pad surfaces in contact with the substrate and first die faces, respectively, the conductor pad including a plurality of mutually electrically isolated electrically conductive elements extending between the first and second surfaces thereof in the direction of alignment between the substrate and die contacts so as to provide electrical conduction between the pad surfaces, adjacent conductive elements being spaced apart by less than the minimum width of the contacts; and d) means for holding the semiconductor die and the conductor substrate in contact with the conductor pad so that the corresponding die and substrate contacts are in alignment.

2. A semiconductor die mounting system as in claim 1 wherein the means for holding the semiconductor die and the conductor pad includes a nest plate mounted over the conductor substrate for aligning the contacts on the conductor substrate with the contacts on the semiconductor die and a cover mounted on the nest plate.

3. A semiconductor die mounting system as in claim 2 wherein:
a) the cover includes a cover face; and
b) the semiconductor mounting system further includes a second conductor pad disposed between the semiconductor die and the cover, the second conductor pad having first and second opposed surfaces in contact with a cover face and the second die face, respectively, and including a plurality of thermally conductive elements extending between the first and second surfaces so as to provide thermal conduction between the die and the cover.

4. A semiconductor die mounting system as in claim 3 further comprising means for sealing the periphery of the cover to the periphery of the conductor substrate so that the semiconductor die and the conductor pads are compressed against the conductor substrate.

5. A semiconductor die mounting system as in claim 3 wherein the first-mentioned and second conductor pads are resilient.

6. A semiconductor die mounting system as in claim 2 wherein the cover is a heat sink.

7. A semiconductor die mounting system as in claim 1 wherein the conductor pad is resilient.

8. A semiconductor die mounting system as in claim 1 wherein the conductor substrate is a ceramic substrate.

9. A semiconductor die mounting system as in claim 1 wherein the substrate includes a pin grid on a face opposite the array of contacts.

10. A semiconductor die mounting system as in claim 1 wherein the substrate includes edge connectors formed about its periphery.

11. A semiconductor die mounting system as in claim 1 wherein the substrate includes a plurality of arrays of contacts formed on the substrate face and wherein a separate conductor pad is mounted on each array of contacts.

12. A semiconductor die mounting system comprising:
a) a conductor substrate having an array of substrate contacts on a substrate face thereof;
b) at least one semiconductor die having first and second opposed die faces and a plurality of die contacts on the first die face thereof disposed in alignment with corresponding substrate contacts on the conductor substrate;
c) a first conductor pad disposed between the substrate and the die having first and second opposed pad surfaces in contact with the substrate and first die faces, respectively, the conductor pad including a plurality of mutually electrically isolated electrically conductive elements extending between the first and second surfaces thereof in the direction of alignment between the substrate and die contacts so as to provide electrical conduction between the pad surfaces, adjacent conductive elements being spaced apart by less than the minimum width of the contacts;
d) means for holding the semiconductor die and the conductor substrate in contact with the first conductor pad so that the corresponding die and substrate contacts are in alignment;
e) a cover mounted on the means for holding the semiconductor die and the conductor substrate, the cover including a cover face; and
f) a second conductor pad disposed between the semiconductor die and the cover, the second conductor pad having first and second opposed surfaces in contact with a cover face and the second die face, respectively, and including a plurality of thermally conductive elements extending between the first and second surfaces so as to provide thermal conduction between the die and the cover.

13. A semiconductor die mounting system as in claim 12 wherein the means for holding the semiconductor die and the conductor pad includes a nest plate mounted over the conductor substrate for aligning the contacts on the conductor substrate with the contacts on the semiconductor die.

14. A semiconductor die mounting system as in claim 12 further comprising means for sealing the periphery of the cover to the periphery of the conductor substrate so that the semiconductor die and the conductor pads are compressed against the conductor substrate.

15. A semiconductor die mounting system as in claim 12 wherein the first and second conductor pads are resilient.

16. A semiconductor die mounting system as in claim 12 wherein the cover is a heat sink.

17. A semiconductor die mounting system comprising:
a) a conductor substrate having an array of substrate contacts on a substrate face thereof;
b) at least one semiconductor die having first and second opposed die faces and a plurality of die contacts on the first die face thereof disposed in alignment with corresponding substrate contacts on the conductor substrate;
c) a first conductor pad disposed between the substrate and the die having first and second opposed pad surfaces in contact with the substrate and first die faces, respectively, the conductor pad including a plurality of mutually electrically isolated electrically conductive elements extending between the first and second surfaces thereof in the direction of alignment between the substrate and die contacts so as to provide electrical conduction between the pad surfaces, adjacent conductive elements being spaced apart by less than the minimum width of the contacts;
d) a nest plate mounted over the conductor substrate for aligning the contacts on the conductor substrate with the contacts on the semiconductor die;
e) a cover having a cover face mounted on the nest plate; and
f) a second conductor pad disposed between the semiconductor die and the cover, the second conductor pad having first and second opposed surfaces in contact with a cover face and the second die face, respectively, and including a plurality of thermally conductive elements extending between the first and second surfaces so as to provide thermal conduction between the die and the cover.

18. A semiconductor die mounting system as in claim 17 further comprising means for sealing the periphery of the cover to the periphery of the conductor substrate so that the semiconductor die and the conductor pads are compressed against the conductor substrate.

19. A semiconductor die mounting system as in claim 17 wherein the first and second conductor pads are resilient.

20. A semiconductor die mounting system as in claim 17 wherein the cover is a heat sink.

* * * * *